United States Patent
Wang

(10) Patent No.: US 8,817,546 B2
(45) Date of Patent: Aug. 26, 2014

(54) COMPLEMENTARY ELECTRICAL ERASABLE PROGRAMMABLE READ ONLY MEMORY

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 221 days.

(21) Appl. No.: 13/454,871

(22) Filed: Apr. 24, 2012

(65) Prior Publication Data

US 2013/0279266 A1     Oct. 24, 2013

(51) Int. Cl.
 | | |
 |---|---|
 | *G11C 16/04* | (2006.01) |
 | *G11C 14/00* | (2006.01) |
 | *G11C 11/404* | (2006.01) |
 | *G11C 16/26* | (2006.01) |
 | *G11C 7/10* | (2006.01) |

(52) U.S. Cl.
    CPC ............ *G11C 14/00* (2013.01); *G11C 14/0018* (2013.01); *G11C 11/404* (2013.01); *G11C 7/1045* (2013.01); *G11C 16/26* (2013.01)
    USPC ............. 365/185.24; 365/185.18; 365/185.26

(58) Field of Classification Search
    CPC .. G11C 14/00; G11C 14/0018; G11C 11/404; G11C 16/26; G11C 7/1045
    USPC ............................ 365/185.24, 185.18, 185.26
    See application file for complete search history.

(56) References Cited

U.S. PATENT DOCUMENTS

| | | | | |
|---|---|---|---|---|
| 5,488,579 A | * | 1/1996 | Sharma et al. | 365/185.08 |
| 7,164,608 B2 | * | 1/2007 | Lee | 365/189.05 |
| 7,263,001 B2 | * | 8/2007 | Wang et al. | 365/185.25 |
| 8,279,681 B2 | * | 10/2012 | Yao et al. | 365/185.28 |
| 8,355,282 B2 | * | 1/2013 | Ching et al. | 365/185.15 |

* cited by examiner

*Primary Examiner* — Pho M Luu
(74) *Attorney, Agent, or Firm* — Muncy, Geissler, Olds & Lowe, P.C.

(57) ABSTRACT

Complementary Electrical Erasable Programmable Read Only Memory (CEEPROM) is disclosed. CEEPROM cell comprises a pair of non-volatile memory elements and one access transistor. The two elements of the non-volatile memory pair are configured to be one with high electrical conductance and the other with low electrical conductance. The positive voltage $V_{DD}$ for digital value "1" and ground voltage $V_{SS}$ for digital value "0" are connected to the two input nodes of the two non-volatile elements respectively after configuration. The digital signal either $V_{DD}$ or $V_{SS}$ passed through the high conductance non-volatile memory element in the pair is directly accessed by the access transistor without applying a sense amplifier as the conventional EEPROM would require. Without sense amplifiers, the digital data in CEEPROM can be fast accessed. The power consumption and the silicon areas required for sense amplifiers can be saved as well.

25 Claims, 11 Drawing Sheets

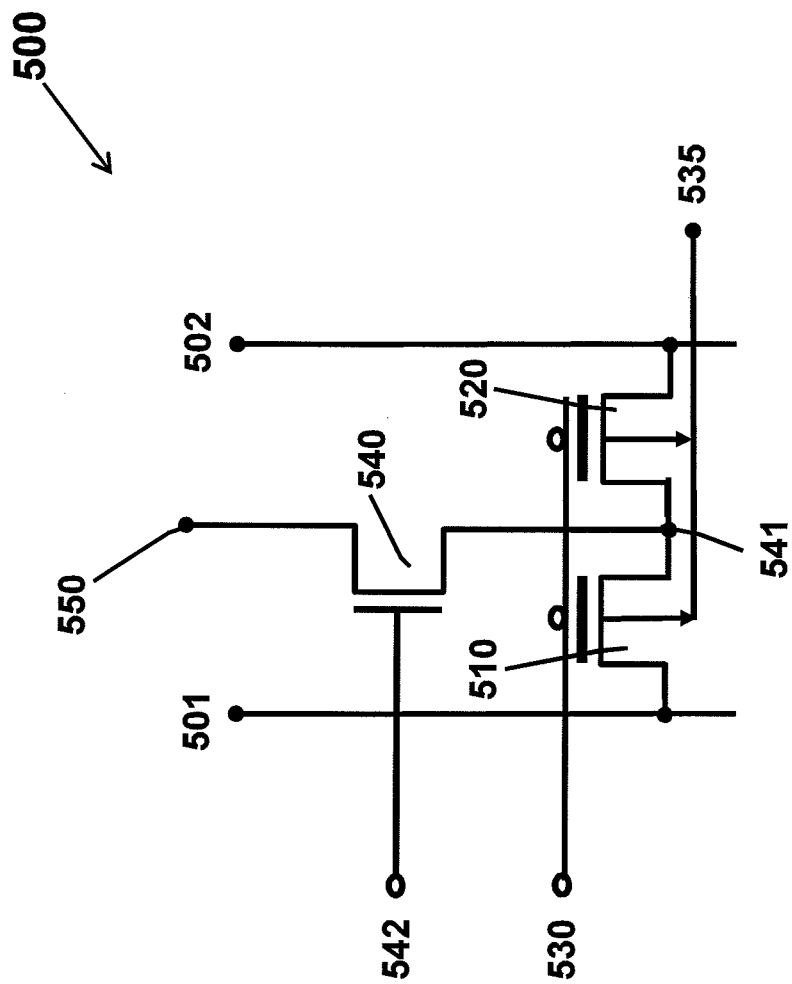

COMPLEMENTARY ELECTRICAL ERASABLE PROGRAMMABLE READ ONLY MEMORY

BACKGROUND OF THE INVENTION

1. Field of the Invention

This invention relates to reprogrammable non-volatile memory devices able to output stored digital information "1" or "0" without applying a sense amplifier. In particular, Complementary Electrical Erasable Programmable Read Only Memory (CEEPROM) is configured to a static stored signal of either $V_{DD}$ ("1") or $V_{SS}$ ("0") in the memory cell. The digital data in the memory cell are directly accessed by an access transistor without passing through a sense amplifier.

2. Description of the Related Art

In the digital world of electronic systems, Complementary Metal-Oxide Semiconductor (CMOS) process becomes the most popular fabrication process for Application Specific Integrated Circuit (ASIC). An ASIC contains the specific functionality of a device or a system on a single Integrated Circuit (IC) or a chip. Changes for the specific functionality or configurations are required in many applications. For example, the initial programming and configuring a microprocessor require a programmable and non-volatile memory to store the programmed instructions. The programmed instructions shall be allowed to change any time without changing the hardware during developments. This requirement for electronic systems is done by Electrically Erasable Programmable Read-Only Memory (EEPROM) device.

The conventional semiconductor EEPROM devices usually consist of a charge storing memory cell 120 and an access MOSFET (Metal-Oxide-Semiconductor Field Effect Transistor) 110 as the schematic shown in FIG. 1. The charge storing memory cell 120 is a MOSFET with a layer of charge storage material 122 under the control gate 124 and above the channel surface of a MOSFET. The amounts of charges in the storing layer 122 can affect the threshold voltage applied to the control gate 124 to turn on the channel of the MOSFET memory cell. For instance, the threshold voltage of N-type semiconductor memory cell shifts to a higher voltage from storing electrons (negative charge) in the charge storage layer. While the threshold voltage of P-type semiconductor memory cell shifts to a lower voltage from storing electrons (negative charge) in the charge storage layer. By injecting into the storing layer of the semiconductor memory cell to cause threshold voltage changes, the electrical conductance of the semiconductor memory cell is also altered, when applying a voltage bias to the control gate of the semiconductor memory cell. The semiconductor memory cells become non-volatile, if the charges in the storing layer can be retained for a long period of time (>10 years for a typical semiconductor non-volatile memory). If a non-volatile memory element can perform the cycles of erase/programming operations the non-volatile memory is Multiple Times Programming Non-Volatile Memory (MTPNVM). Usually, the numbers of erase/programming cycling for a semiconductor non-volatile memory are between thousands to millions times.

In the conventional scheme of reading out a stored bit in EEPROM as depicted in FIG. 2, the source and drain electrodes of the semiconductor memory cell 120 are connected to ground node and the source electrode of the access transistor 110, respectively. The drain electrode of the access transistor 110 is then attached to a bitline. The control gate of semiconductor memory cell 120 is biased with a constant voltage $V_{CG}$. The access transistor 110 is activated to attach to the bitline by applying a voltage bias $V_G$. A current source configured with a constant voltage bias $V_R$ to one node of a load device 220 and the other node connected to the bitline passes electrical current $I_{CELL}$ through the access transistor 110 to the ground node of the semiconductor memory cell 120. The cell current $I_{CELL}$ flowing through the memory cell varies according to the conductance of the memory cell altered by the threshold voltage change with a constant control gate voltage bias $V_{CG}$. The cell current $I_{CELL}$ is then proportionally amplified by a current mirror circuitry 210. By comparing the amplified cell current with a reference current $I_{REF}$, the bit information ("1" and "0") is read out by a current comparator 230. That is, the output signal of the comparator 230 is $V_{DD}$ (logic "1") for amplified cell current greater than the reference current or $V_{SS}$ (logic "0") for amplified cell current less than reference current and vise versa. Since the DC currents including the amplified cell currents (cell current+mirror current) and the reference current are compared in the conventional readout scheme the required total sensing power is high. The DC current consumption is usually greater than 100 s μA per cell for a typical semiconductor non-volatile memory not including the switching currents of outputting "1" or "0".

In this invention we apply two non-volatile memory elements and one access transistor to form a Complementary Electrical Erasable Programmable Read Only Memory (CEEPROM) cell. The CEEPROM outputs digital signals $V_{DD}$ ("1") and $V_{SS}$ ("0") without going through a sense amplifier. The digital datum from the CEEPROM can be fed into to digital circuitries directly. The CEEPROM can provide fast-access, simple, low power, and cost effective solutions for embedded re-configurable digital integrated circuitries.

SUMMARY OF THE INVENTION

CEEPROM cell 300 comprises two re-configurable non-volatile elements 310 and 320 and one access transistor 340 as shown in FIG. 3. The re-configurable non-volatile elements 310 and 320 can be repeatedly programmed and erased to two distinct "on" and "off" states for MTP application. The "on" state and "off" state for the non-volatile elements 310 and 320 indicate the high and low conductance of the non-volatile elements, respectively. The input node 311 of non-volatile element 310 and the input node 321 of non-volatile element 320 are connected to the positive voltage supply $V_{DD}$ and the ground voltage $V_{SS}$ for digital circuitries, respectively. The output nodes of two non-volatile elements 310 and 320 are connected to the input node 341 of the access transistor 340. The access transistor 340 is turned on to pass the voltage signal at node 341 to the output node 350 by applying a voltage bias $V_G$ larger than ($V_{thn}+V_{DD}$) to the gate electrode 342 of access transistor 340, where $V_{thn}$ is the threshold voltage of the access transistor 340. In the configuration mode, the complementary non-volatile elements 310 and 320 is always configured to one "on" and the other "off". For the case in FIG. 3, non-volatile element 310 and non-volatile element 320 are programmed (erased) to "on" and "off" state, respectively for storing bit "1". While non-volatile element 310 and non-volatile element 320 are programmed (erased) to "off" and "on" state, respectively for storing bit "0".

Since CEEPROM 300 outputs digital signals "1" ($V_{DD}$) and "0" ($V_{SS}$), CEEPROM 300 does not require sense amplifier and current comparator to convert the responding cell currents of the non-volatile elements into digital voltage signals. The output signals of CEEPROM 300 can be directly fed into digital circuitries. CEEPROM 300 offers excellent compatibility with digital circuitries. Although CEEPROM 300 requires two non-volatile memory elements 310 and 320 for the complementary pair, one element more than the conventional EEPROM, the omission of sense amplifier and current comparator circuitry may result in more silicon area saving for small density embedded digital circuit applications. It is also emphasized that the active and standby power for CEEPROM 300 is the most significant saving without the sense amplifier and current comparator circuitries.

In another aspect of CEEPROM, the CEEPROM 300 can be applied in the Multiple Times Programmable (MTP) non-volatile devices in the typical structure of one non-volatile element and one access transistor such as semiconductor non-volatile memory device (conventional EEPROM), Phase Change Memory (PCM), Programmable Metallization Cell (PMC), Magneto-Resistive Random Memories (MRAM), Ferroelectric Random Access Memory (FRAM), Resistive Random Access Memory (RRAM), and Nano-Random Access Memory (NRAM), without having current sense amplifier reading out digital signals.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
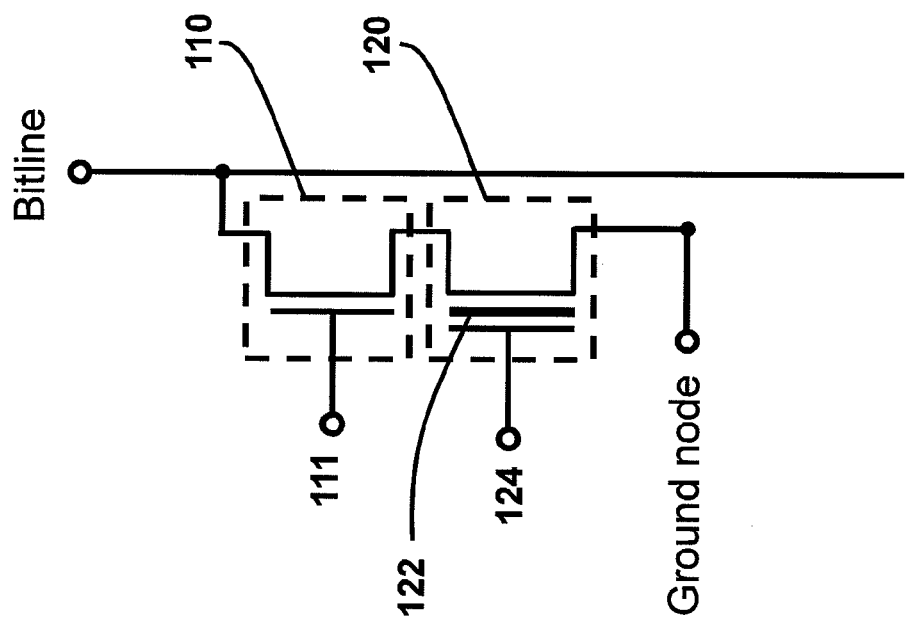
FIG. 1 shows the schematic of a conventional Electrical Erasable Programmable Read Only Memory (EEPROM).
Figure 2:
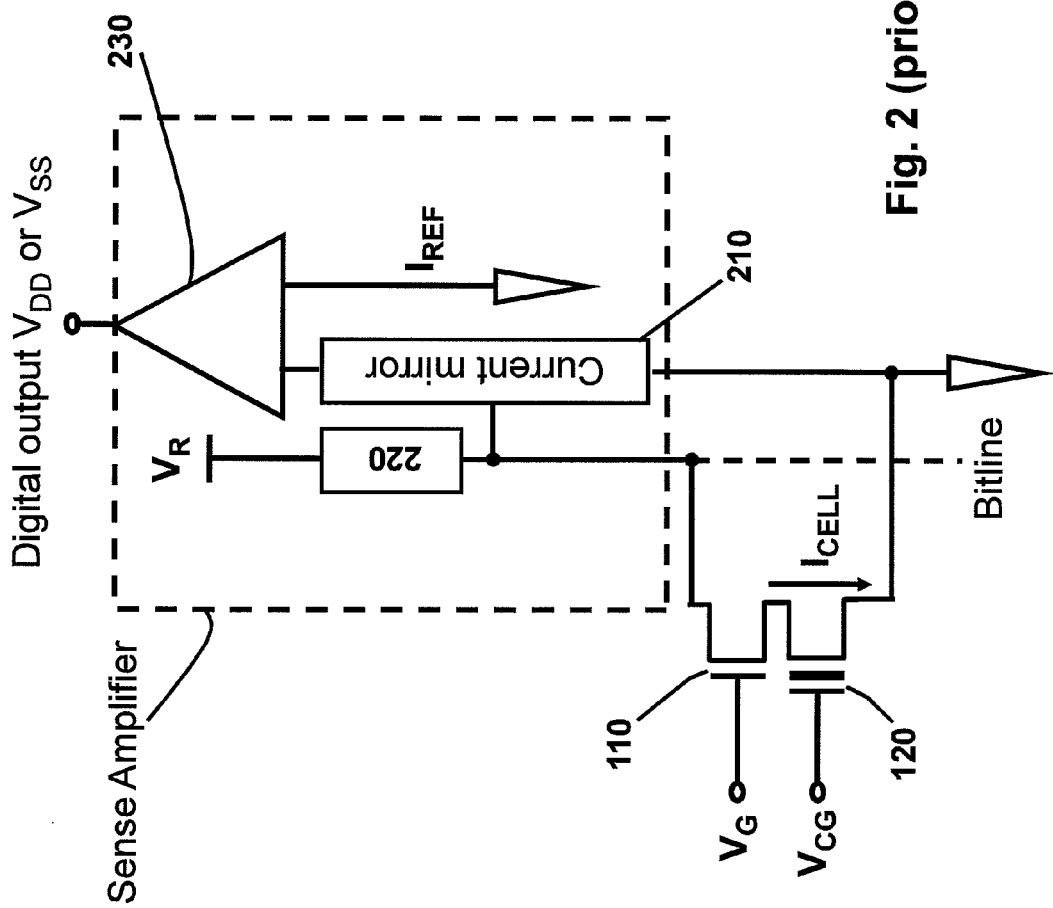
FIG. 2 shows the readout schematic for a conventional Electrical Erasable Programmable Read Only Memory (EEPROM).
Figure 3:
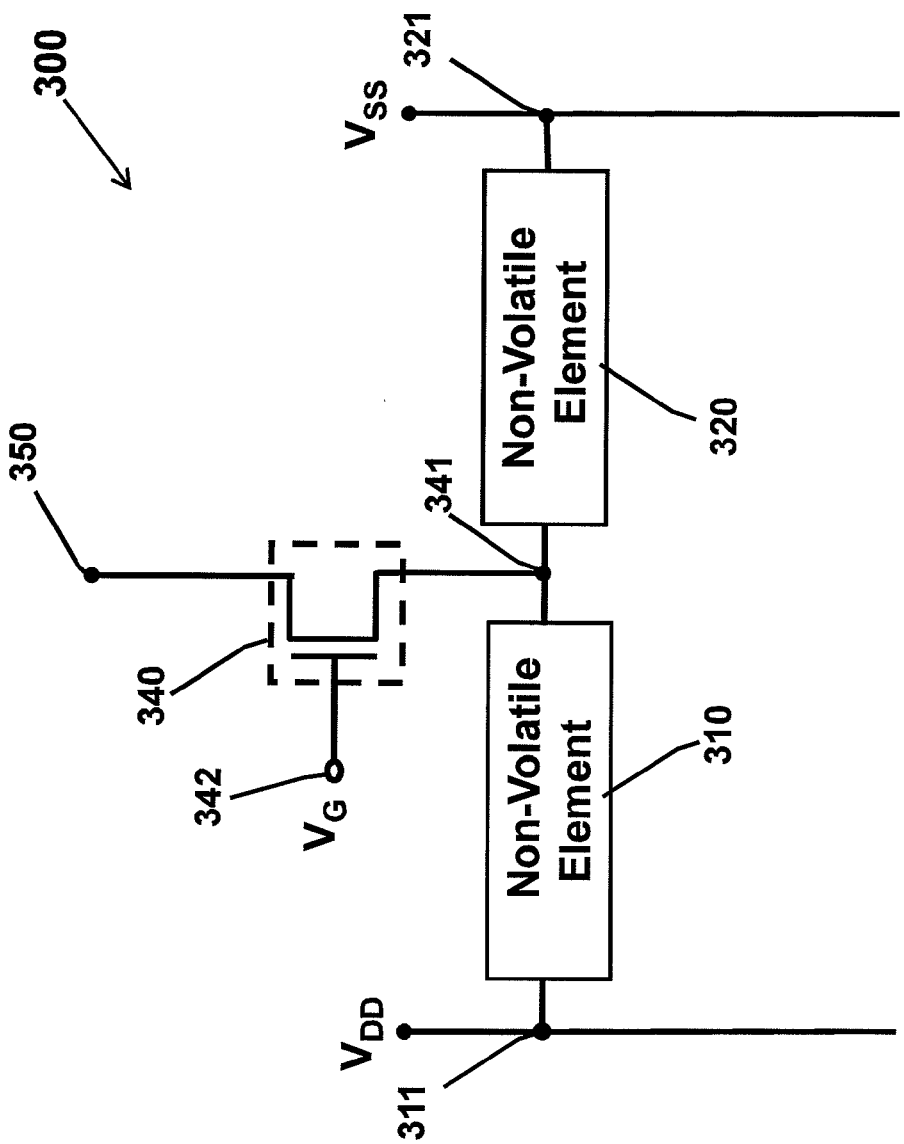
FIG. 3 shows the general schematics of CEEPROM consisting of a pair of complementary non-volatile elements, and one access transistor according to the invention.
Figure 4A:
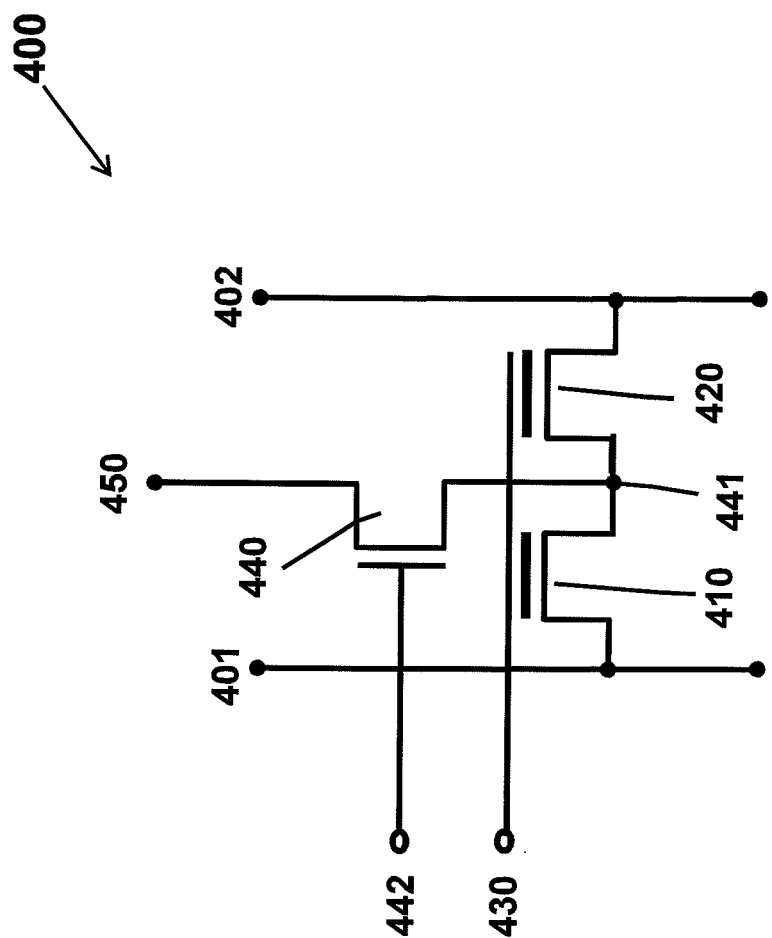
FIG. 4 shows one embodiment of CEEPROM using two N-type semiconductor non-volatile memory elements and one N-type access MOSFET (a) schematic; (b) voltage biases at the nodes of a CEEPROM cell for configuring bit "0"; (c) voltage biases at the nodes of a CEEPROM cell for configuring bit "1"; (d) voltage biases at the nodes of a CEEPROM cell in normal read mode after configuration.

The schematic for a CEEPROM cell 400 consisting with a pair of complementary N-type semiconductor non-volatile memory elements 410 and 420, and one access N-type MOSFET 440 is shown in FIG. 4a. The complementary N-type semiconductor non-volatile memory elements 410 and 420 are controlled by the same control gate 430. The source electrodes 401 and 402 of the complementary N-type semiconductor non-volatile memory elements 410 and 420 form voltage bias input nodes for positive voltage supply $V_{DD}$ and ground voltage $V_{SS}$, respectively. The drain electrodes 441 of the complementary N-type semiconductor non-volatile elements 410 and 420 are connected together to the source electrode 441 of the N-type access MOSFET 440. A voltage bias $V_G$ greater than $(V_{DD}+V_{thn})$ is applied to the gate electrode 442 of the N-type access MOSFET 440 to pass the signals at node 441 to the output node 450 of the CEEPROM 400, where $V_{thn}$ is the threshold voltage of the access transistor 440.

Before configuring the complementary N-type semiconductor non-volatile memory elements 410 and 420, the N-type semiconductor non-volatile memory elements are initially in the erased state, where the N-type semiconductor non-volatile memory elements have lower threshold voltages to be turned on. A voltage bias below the lower threshold voltages must be applied to the control gate 430 to deactivate devices 410 and 420 in the erased state to prevent large current passing the complementary N-type semiconductor non-volatile memory elements 410 and 420 from positive voltage $V_{DD}$ to ground $V_{SS}$. The N-type semiconductor non-volatile memory elements 410 and 420 are configured by programming either one of the two complementary memory elements to a higher threshold voltage by injecting electrons to its charge storing material. For instance, Hot Carrier Injection (HCI) can be applied to inject electrons into the storing material of an N-type semiconductor non-volatile memory element.

Figure 4B:
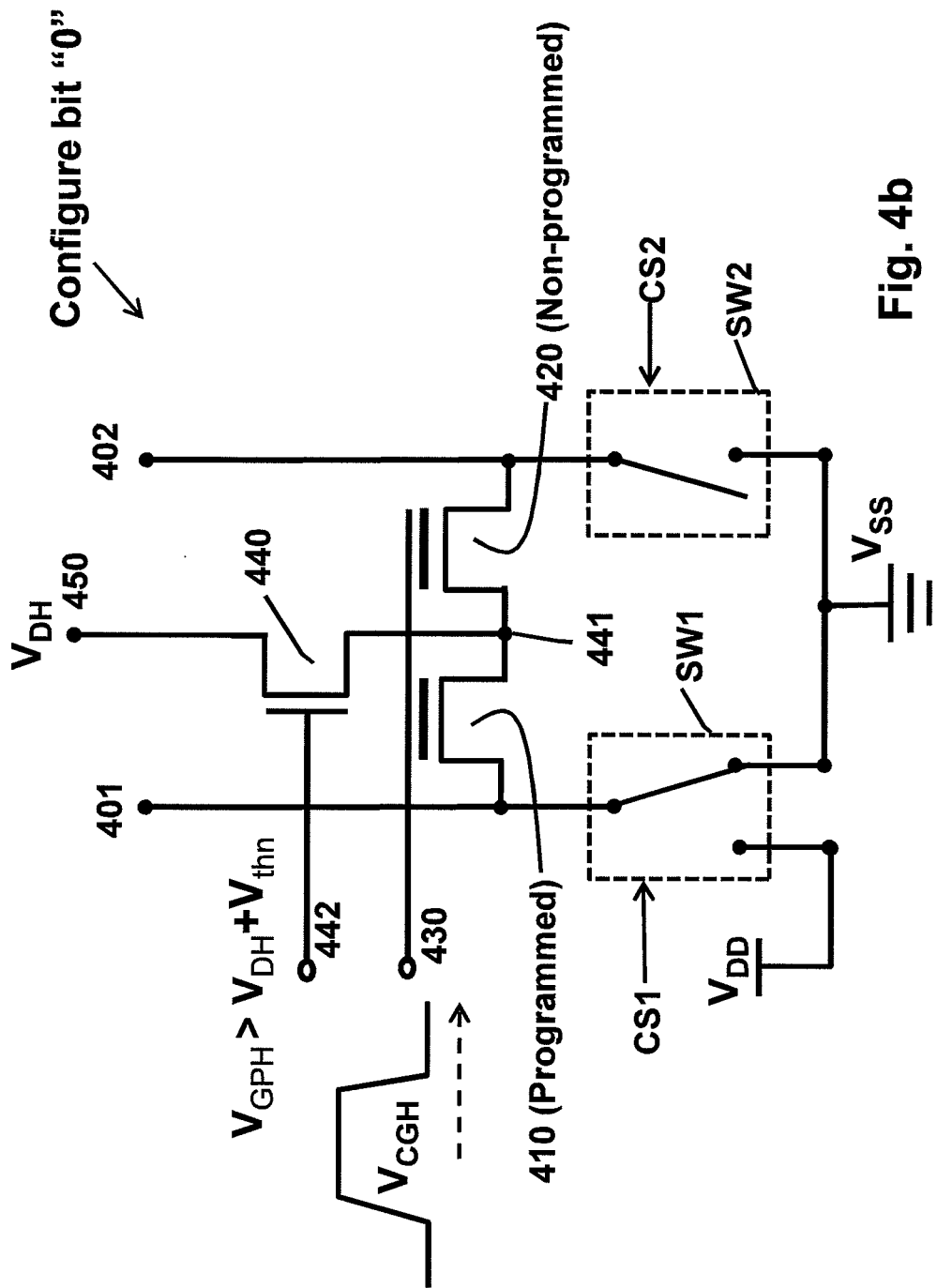
Figure 4C:
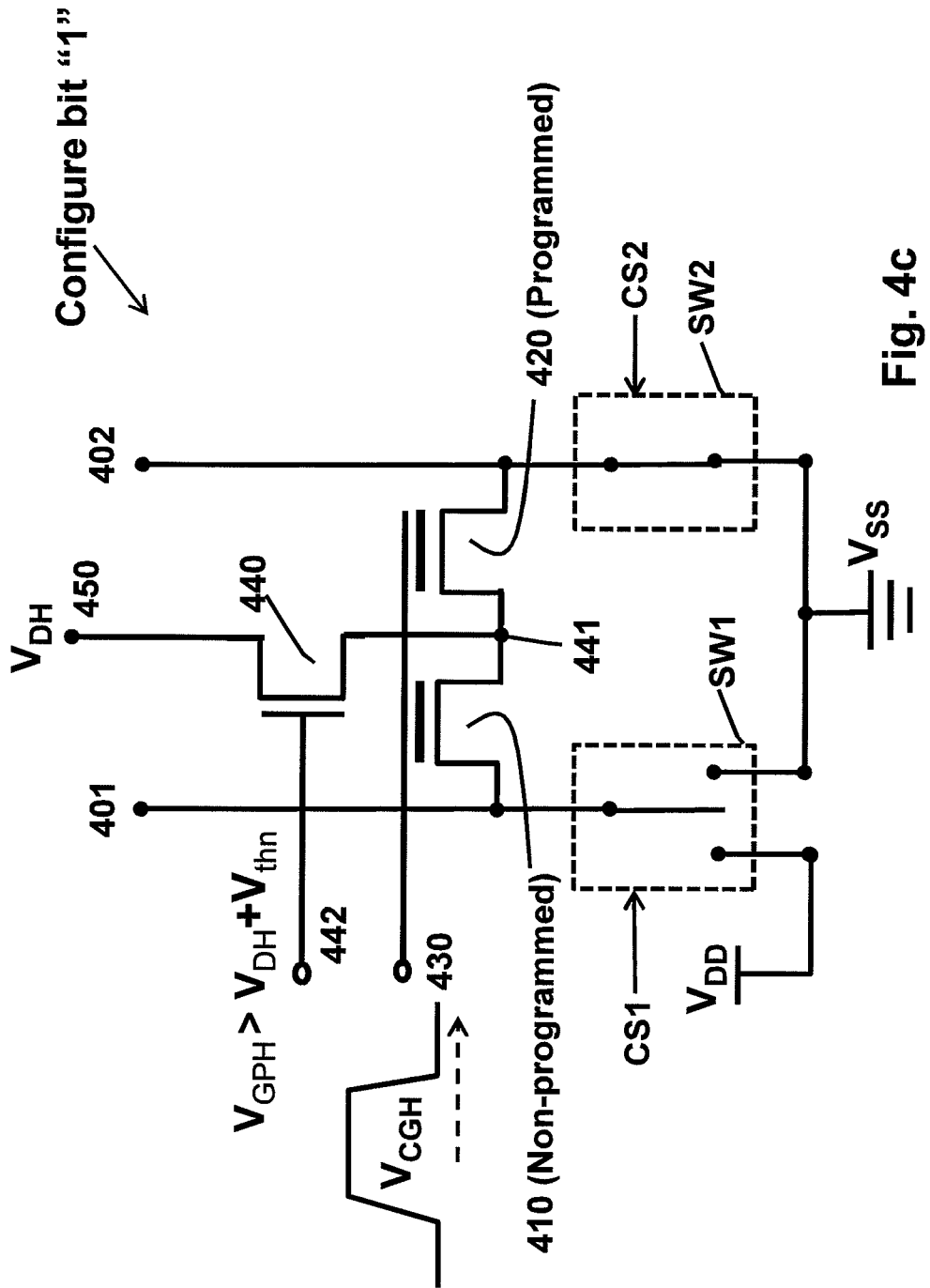

FIG. 4b and FIG. 4c are the voltage biases at the electrodes of the CEEPROM by applying HCI programming for configuring bit "0" and bit "1", respectively. During configuring a storing bit into the CEEPROM cell, a high voltage bias $V_{DH}$ (3.5V~5V) are passed to the drain electrodes 441 of semiconductor non-volatile memory elements 410 and 420 by applying a gate voltage $V_{GPH}$ higher than $(V_{DH}+V_{thn})$ to the gate electrode 442 of access transistor 420. For configuring bit "0" as shown in FIG. 4b, the input node 401 of element 410 is connected to the ground voltage $V_{SS}$ by a switch SW1 according to a control signal CS1 while the input node 402 of element 420 is floating by a switch SW2 according to a control signal CS2. When a voltage pulse with amplitude $V_{CGH}$ (5V~8V) are applied to the control gate 430 for about several μs, element 410 is turned on to flow electron current from the input node 401 toward the drain electrode 441 of element 410. The hot carriers (electrons and holes) are generated near the depletion region of the drain electrode of element 410 by the impacted ionization of injecting electron current from the input node 401. Consequently the energetic hot electrons are injected into its charge storing material. The threshold voltage of N-type semiconductor non-volatile memory element 410 is thus shifted to a higher threshold voltage by electrons in the storing material. On the other hand, since the input electrode 402 of element 420 are floating without connecting to any voltage bias, the voltage bias $V_{DH}$ at the drain node 441 is directly passed to the input node 402 of element 420 with the application of control gate voltage pulse $V_{CGH}$. No hot carriers in element 420 are generated. The threshold voltage of N-type semiconductor non-volatile memory element 420 remains the same as its erased threshold voltage. The programming process can take place simultaneously for configuring bit "1" in another CEEPROM cell with floating node 401 and grounded node 402 as shown in FIG. 4c.

Figure 4D:
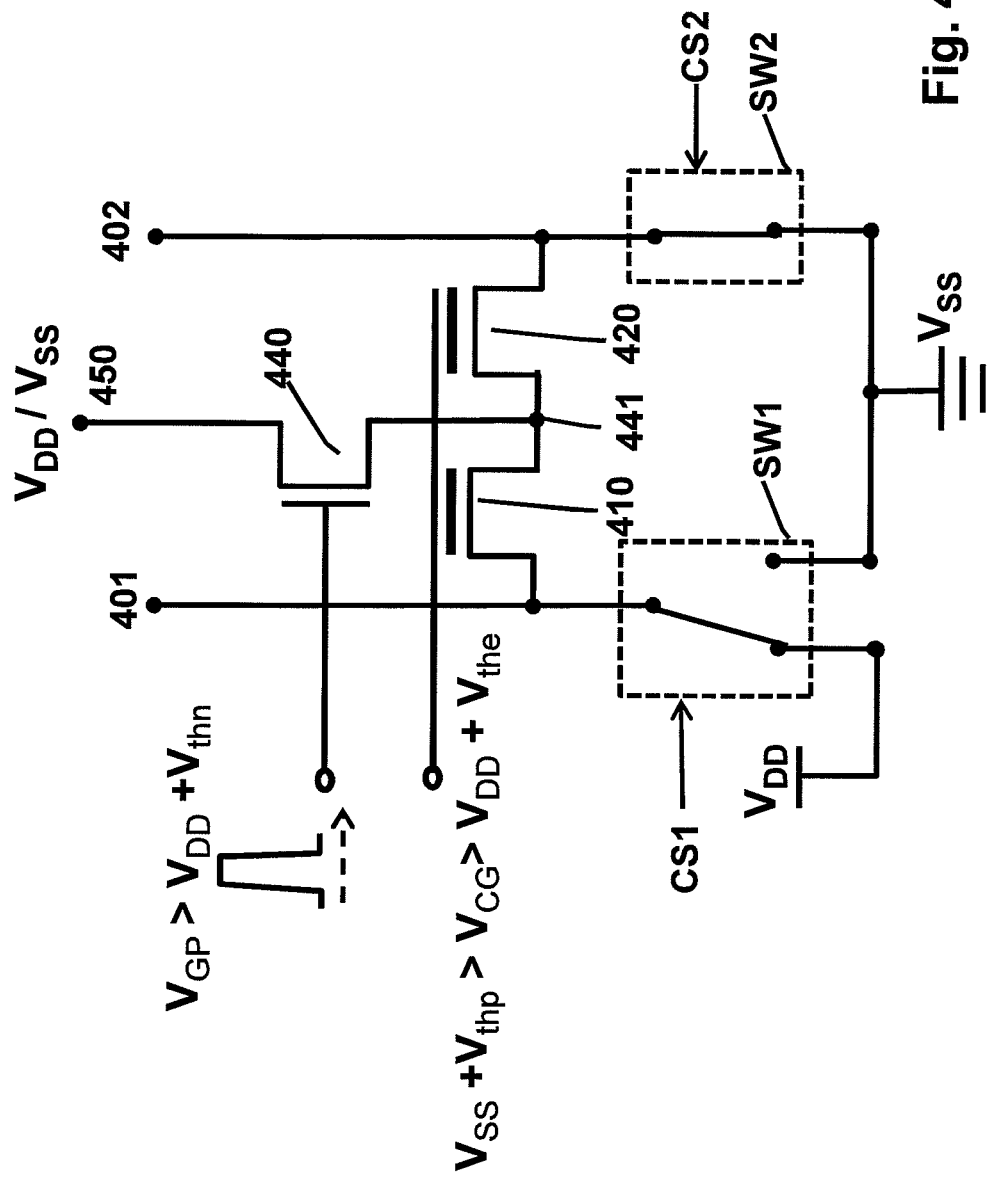

In the normal read mode after configuration as shown in FIG. 4d, the input node 401 of element 410 is connected to the positive voltage supply $V_{DD}$ by the switch SW1 according to the control signal CS1 and the input node 402 of element 420 is connected to the ground voltage $V_{SS}$ by the switch SW2 according to the control signal CS2 for the digital circuitry. A constant voltage bias $V_{CG}$ (wherein $(V_{DD}+V_{the})<V_{CG}<(V_{SS}+V_{thp})$) is applied to the control gate 430, that is, $V_{CG}$ can turn on the N-type non-volatile memory element with low threshold voltages (erased) $V_{the}$ to pass $V_{DD}$, and turn off the N-type non-volatile memory element with high threshold voltages (programmed) $V_{thp}$. The voltage potential at the node 441 is either $V_{DD}$ for bit "1" or $V_{SS}$ for bit "0" after configuration. To access the bit information of CEEPROM 400, the voltage signal of either $V_{DD}$ or $V_{SS}$ is passed to the output node 450 of the CEEPROM by applying a voltage bias $V_{GP}$ greater than $(V_{DD}+V_{thn})$ to the gate 442 of access transistor 440. The voltage signal at the output node 450 can be directly applied to logic gates in the digital circuitries.

In the standby read mode with the access transistor 440 "off", the total steady current flowing from $V_{DD}$ to $V_{SS}$ through the complementary pair of "on" and "off" (or "off" and "on") non-volatile memory elements is the "off" leakage current for a single non-volatile memory element. Usually the "off" leakage current for an N-type semiconductor non-volatile memory element could be as low as about pA per element as those of typical complementary MOSFET devices used in digital circuitries. Therefore, the standby current consumption for the CEEPROM 400 is compatible with those of Static Random Access Memory (SRAM) mostly applied in digital circuitries.

To erase the digital configuration in CEEPROM 400, the Fowler-Nordheim tunneling scheme can be applied to the N-type semiconductor non-volatile memory elements 410 and 420. After erasing the N-type semiconductor non-volatile memory elements to the lower threshold voltage state, CEEPROM 400 is ready for new configuration. The CEEPROM is a Multiple Times Configurable (MTC) non-volatile memory.

In another embodiment CEEPROM 500 comprises with a pair of complementary P-type non-volatile memory elements 510 and 520, and one N-type access MOSFET 540 as the schematic shown in FIG. 5a. The complementary P-type semiconductor non-volatile elements 510 and 520 are embedded inside an N-type well connected by the N-well electrode 535. The complementary P-type semiconductor non-volatile memory elements 510 and 520 are controlled by the same control gate 530. The source electrodes 501 and 502 of the P-type semiconductor non-volatile memory elements 510 and 520 form the voltage bias input nodes for positive voltage supply $V_{DD}$ and ground voltage $V_{SS}$, respectively. The drain electrodes 541 of the P-type semiconductor non-volatile devices 510 and 520 are connected together to the source electrode 541 of the N-type access MOSFET 540. A voltage bias $V_G$ greater than $(V_{thn}+V_{DD})$ is applied to the gate electrode 542 of the N-type access MOSFET 540 to pass the signals at node 541 to the output node 550 of the CEEPROM 500, where $V_{thn}$ is the threshold voltage of the access transistor 540.

Before configuring the P-type semiconductor non-volatile memory elements 510 and 520, the P-type semiconductor non-volatile memory elements are initially in the erased state, where the P-type semiconductor non-volatile memory elements have lower threshold voltages (toward more negative side of voltage), that is, turning on the P-type non-volatile memory elements requires more negative applied control gate voltage relative to the source electrodes of the elements. The P-type non-volatile memory elements are initially "off" by applying the same positive voltage bias to the control gate 530, source electrodes 501 and 502, and well electrode 535 of the complementary P-type non-volatile memory elements. The complementary P-type semiconductor non-volatile memory elements 510 and 520 are configured by programming either one of the two elements to a higher threshold voltage (toward more positive side of voltage), that is, turning off the P-type non-volatile memory elements requires more positive applied control gate voltage relative to the source electrodes of the elements by injecting electrons to its charge storing material. For instance, p/n junction Band-To-Band (BTB) hot electron injection can be applied to inject electrons into the storing material of a P-type semiconductor non-volatile memory element. The programmed P-type non-volatile memory elements (threshold voltage shifted more positive) can be turned off only with a more relatively positive control gate voltage. Thus, in the configuration of FIG. 5a one of the complementary P-type non-volatile memory elements after programming (injecting electrons to the storing material) would be always "on" by applying the same positive voltage bias to the control gate 530, source electrodes 501 and 502, and well electrode 535 of the complementary P-type non-volatile memory elements.

Figure 5B:
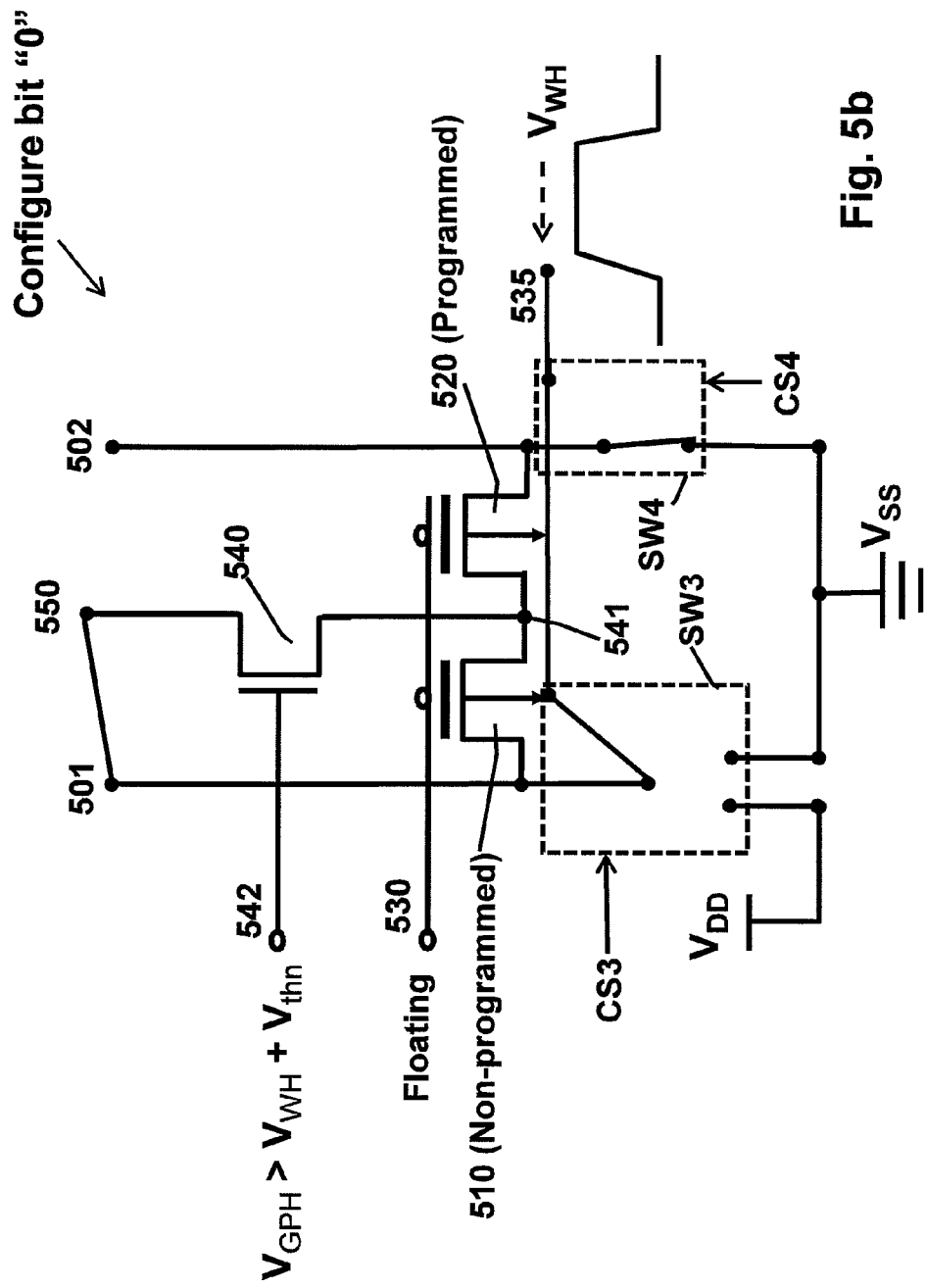
FIG. 5 shows one embodiment of CEEPROM using two P-type semiconductor non-volatile memory elements and one N-type access MOSFET (a) schematic; (b) voltage biases at the nodes of a CEEPROM cell for configuring bit "0"; (c) voltage biases at the nodes of a CEEPROM cell for configuring bit "1"; (d) voltage biases at the nodes of a CEEPROM cell in normal read mode after configuration.
Figure 5C:
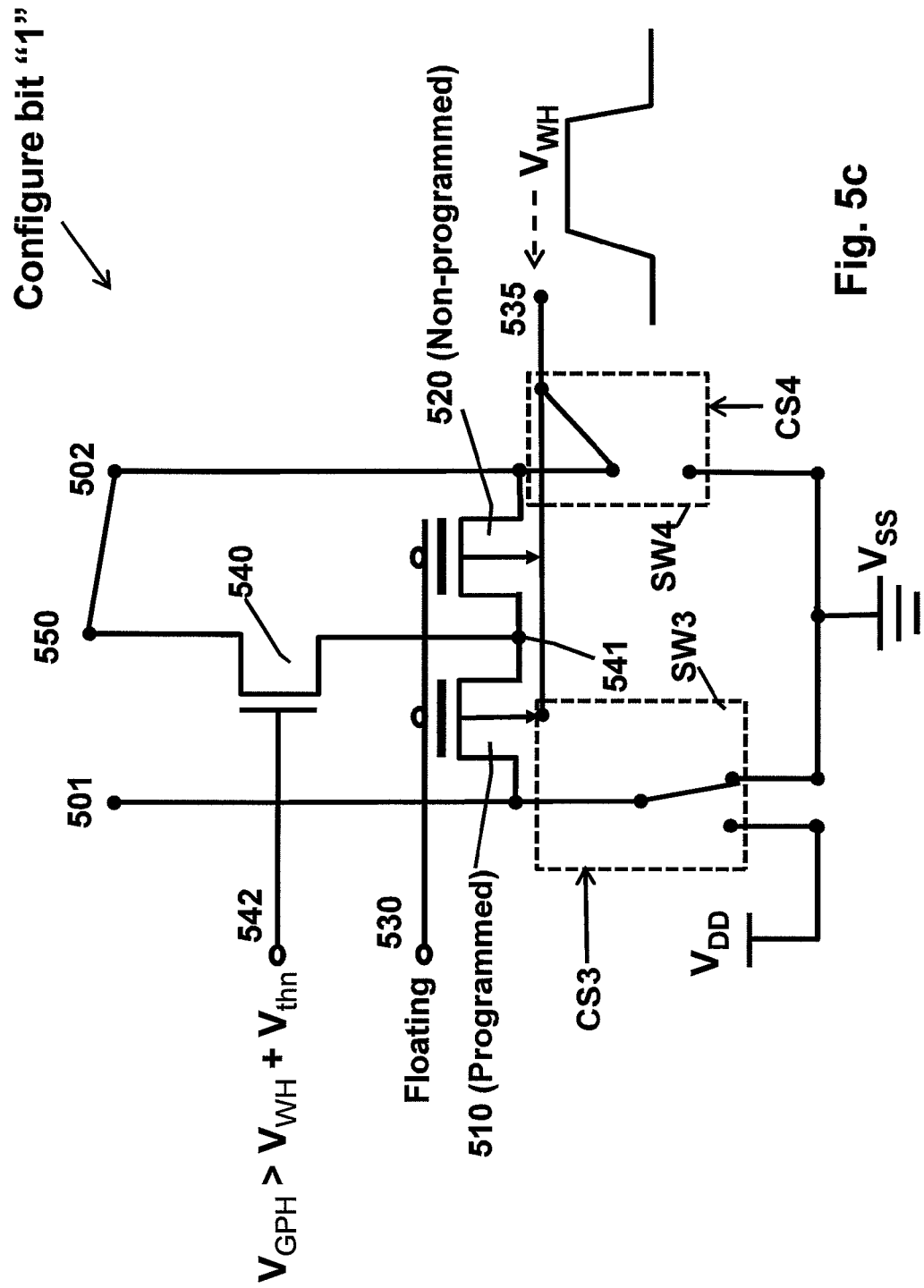

FIG. 5b and FIG. 5c are the voltage biases at the electrodes of the CEEPROM 500 using complementary P-type semiconductor non-volatile memory elements 510 and 520 for configuring bit "0" and bit "1", respectively. For configuring bit "0", the input node 501 of element 510 is connected to the N-type well electrode 535 by a switch SW3 according to a control signal CS3 and the input node 502 of element 520 is connected to the ground voltage $V_{SS}$ by a switch SW4 according to the control signal CS4. The output node 550 and the input node 501 of element 510 are electrically shorted together. The control gates 530 of the elements 510 and 520 are floating. The gate 542 of the N-type MOSFET 540 are applied with a high voltage $V_{GPH}$ greater than $(V_{WH}+V_{thn})$ to equalize the N-type well voltage potential with the P-type drain electrodes of elements 510 and 520, where $V_{WH}$ is the amplitude of the applied voltage bias for BTB tunneling and $V_{thn}$ is the threshold voltage of the N-type access MOSFET 540. When a voltage pulse with amplitude $V_{WH}$ is applied to the N-type well electrode 535 for several μs, the p/n junction of source/well in element 520 are reverse-biased to generate BTB tunneling for facilitating the hot electrons injected into the storing material of element 520. Thus threshold voltage of element 520 shifted to more positive sides requires more positive applied control gate voltage to turn off. The programming process takes place simultaneously for configuring bit "1" in another CEEPROM cell with node 502 connected to N-type well electrode 535 and node 501 connected to ground as shown in FIG. 5c.

Figure 5D:
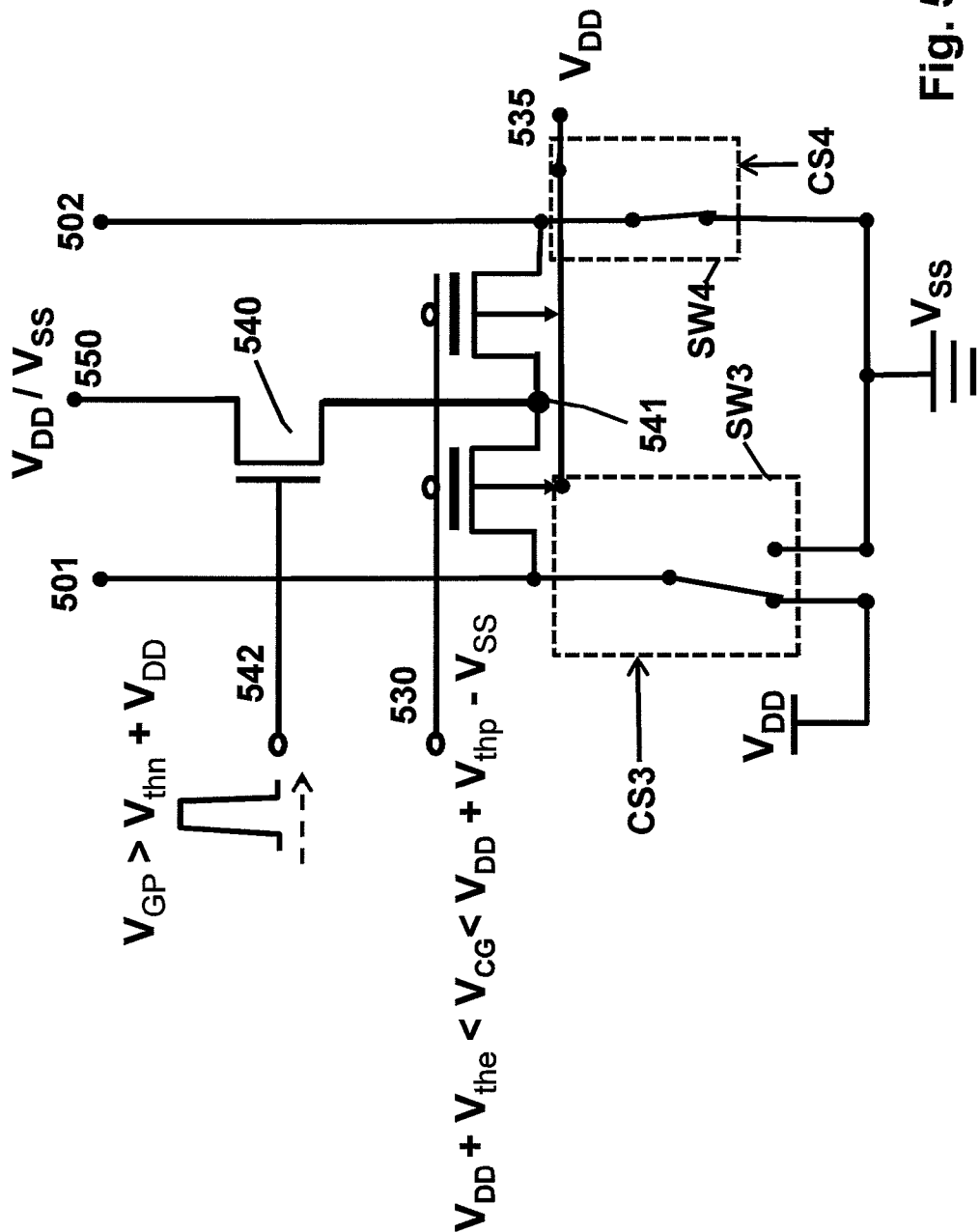

In the normal read mode after configuration as shown in FIG. 5d, the input node 501 of element 510 is connected to the positive voltage supply $V_{DD}$ by the switch SW3 according to the control signal CS3 and the input node 502 of element 520 is connected to the ground voltage $V_{SS}$ by the switch SW4 according to the control signal CS4 for the digital circuitry. The N-type well electrode 535 is also biased to $V_{DD}$. A constant voltage bias $V_{CG}$ (wherein $(V_{DD}+V_{the})<V_{CG}<(V_{DD}+V_{thp}-V_{SS})$) is applied to the control gate 530 such that $V_{CG}$ can turn on the programmed P-type non-volatile devices with threshold voltage $V_{thp}$, and turn off the un-programmed (erased) P-type non-volatile devices with threshold voltage $V_{the}$. Note that for P-type MOSFET, the threshold voltage $V_{the}$ is usually a negative value. For convenience, $V_{CG}$ can be the positive voltage $V_{DD}$, if the threshold voltage shifts of the programmed P-type semiconductor non-volatile elements are able to be fully turned "on" to pass the ground voltage $V_{SS}$ under the applied gate voltage bias $V_{DD}$, that is, $V_{thp}>V_{SS}$, where $V_{thp}$ is the threshold voltage of the programmed P-type non-volatile elements. The voltage potential at the node 541 is either $V_{DD}$ for bit "1" or $V_{SS}$ for bit "0" after configuration. To access the bit information of CEEPROM, the voltage signal of either $V_{DD}$ or $V_{SS}$ is passed to the output node 550 of the CEEPROM by applying a voltage bias $V_{GP}$ greater than $(V_{DD}+V_{thn})$ to the gate 542 of access transistor 540. The voltage signal at the output node 550 can be directly applied to the logic gates in the digital circuitries.

In the standby read mode with the access transistor 540 "off", the total steady current flowing from $V_{DD}$ to $V_{SS}$ through the pair of "on" and "off" (or "off" and "on") non-volatile devices is the "off" leakage current for a single non-volatile device. Usually the "off" leakage current for a P-type semiconductor non-volatile memory element could be as low as few pA per element as those of typical complementary MOSFET devices used in digital circuitries. Therefore, the standby current consumption for the CEEPROM 500 is compatible with those of Static Random Access Memory (SRAM) mostly applied in digital circuitries.

To erase the digital configuration in CEEPROM 500, the Fowler-Nordheim tunneling scheme can be applied to the P-type semiconductor non-volatile elements 510 and 520 to remove the electrons in the storing material. After erasing the P-type semiconductor non-volatile elements 510 and 520 to the lower threshold voltage state CEEPROM 500 (to be turned on by more negative gate voltage relative to the source electrode voltage) is ready for new configuration. The CEEPROM 500 is a Multiple Times Configurable (MTC) non-volatile memory.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory device made of different non-volatile material and the types of access transistors will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A non-volatile memory (NVM) cell, comprising:
an access transistor; and
a first NVM transistor and a second NVM transistor, two control gates of which are connected together and two drain electrodes of which are coupled to a source electrode of the access transistor, wherein each of the two NVM transistors has its own charge storage for varying its threshold voltage independently;
wherein in a read mode, a source electrode of the first NVM transistor is coupled to an operating voltage terminal and a source electrode of the second NVM transistor is coupled to a ground terminal; and
wherein in the read mode after configuration, the two NVM transistors are respectively turned on and turned off and a drain electrode of the access transistor generates an output signal corresponding to a voltage carried by one of the two terminals coupled to the turned on NVM transistor.

2. The NVM cell according to claim 1, which operates without any sense amplifier.

3. The NVM cell according to claim 1, wherein the two NVM transistors are N-type, further comprising:
a first switch coupled to the source electrode of the first NVM transistor for floating or for coupling the source electrode of the first NVM transistor with the ground terminal or with the operating voltage terminal according to a first control signal; and
a second switch coupled to the source electrode of the second NVM transistor for floating or for coupling the source electrode of the second NVM transistor with the ground terminal according to a second control signal.

4. The method according to claim 1, wherein the two NVM transistors after configuration are respectively in an erased state with a first threshold voltage $V_{the}$ and a programmed state with a second threshold voltage $V_{thp}$, wherein the first threshold voltage $V_{the}$ is less than the second threshold voltage $V_{thp}$.

5. The NVM cell according to claim 4, wherein when the two NVM transistors are N-type, one NVM transistor in the erased state is turned on and the other NVM transistor in the programmed state is turned off in the read mode after configuration.

6. The NVM cell according to claim 4, wherein when the two NVM transistors are P-type, one NVM transistor in the erased state is turned off and the other NVM transistor in the programmed state is turned on in the read mode after configuration.

7. The NVM cell according to claim 1, wherein the two NVM transistors are P-type and the two NVM transistors are embedded in an N-type well having a well electrode.

8. The NVM cell according to claim 7, further comprising:
a third switch coupled to the source electrode of the first NVM transistor for coupling the source electrode of the first NVM transistor with one of the ground terminal, the operating voltage terminal and the well electrode according to a third control signal; and
a fourth switch coupled to the source electrode of the second NVM transistor for coupling the source electrode of the second NVM transistor with one of the ground terminal and the well electrode according to a fourth control signal.

9. The NVM cell according to claim 1, which is a Multiple Times Configurable (MTC) NVM cell.

10. A method of configuring a storing bit into a non-volatile memory (NVM) cell, the NVM cell comprises an access transistor, a first NVM transistor and a second NVM transistor, two drain electrodes of the two NVM transistors being coupled to a source electrode of the access transistor, the method comprising:

first, changing threshold voltages of the two NVM transistors to an erased state with a first threshold voltage $V_{the}$;

next, switching off the two NVM transistors;

next, when the storing bit represents zero and the two NVM transistors are N-type or when the storing bit represents one and the two NVM transistors are P-type, maintaining the first threshold voltage $V_{the}$ of one NVM transistor having a source electrode adapted to be grounded in a read mode and programming the other NVM transistor to a second threshold voltage $V_{thp}$ having a source electrode adapted to be coupled to an operating voltage terminal in the read mode; and next, when the storing bit represents one and the two NVM transistors are N-type or when the storing bit represents zero and the two NVM transistors are P-type, maintaining the first threshold voltage $V_{the}$ of one NVM transistor having a source electrode adapted to be coupled to the operating voltage terminal the read mode and programming the other NVM transistor to the second threshold voltage $V_{thp}$ having a source electrode adapted to be grounded in the read mode;

wherein the first threshold voltage $V_{the}$ is less than the second threshold voltage $V_{thp}$.

11. The method according to claim 10, wherein the access transistor and the two NVM transistors are N-type, further comprising:

applying a high voltage $V_{GPH}$ and a high voltage $V_{DH}$ respectively to a gate and a drain of the access transistor after the step of switching off and before the step of maintaining and programming;

wherein $V_{GPH} > (V_{DH} + V_{thn})$ and $V_{thn}$ is a threshold voltage of the access transistor.

12. The method according to claim 11, wherein when the storing bit represents zero, the step of maintaining and programming comprises:

maintaining the first threshold voltage $V_{the}$ of the one NVM transistor having the source electrode adapted to be grounded in the read mode by floating the source electrode of the one NVM transistor;

coupling a ground terminal with the source electrode of the other NVM transistor; and applying a high voltage pulse to the two control gates of the two NVM transistors such that the other NVM transistor is programmed to a programmed state with the second threshold voltage $V_{thp}$.

13. The method according to claim 11, wherein when the storing bit represents one; the step of maintaining and programming comprises:

maintaining the first threshold voltage $V_{the}$ of the one NVM transistor having the source electrode adapted to be coupled to the operating voltage terminal in the read mode;

coupling a ground terminal with the source electrode of the other NVM transistor; and applying a high voltage pulse to the two control gates of the two NVM transistors such that the other NVM transistor is programmed to a programmed state with the second threshold voltage $V_{the}$.

14. The method according to claim 10, wherein the two NVM transistors are P-type and the two NVM transistors are embedded in an N-type well having a well electrode.

15. The method according to claim 14, wherein the step of switching off comprises:

switching off the two NVM transistors by applying a positive voltage bias to the control gates and the source electrodes of the two NVM transistors and the well electrode.

16. The method according to claim 14, wherein when the storing bit represents zero, the step of maintaining and programming comprises:

floating the control gates of the two NVM transistors;

maintaining the first threshold voltage $V_{the}$ of the one NVM transistor adapted to be coupled to the operating voltage terminal in the read mode by coupling a drain electrode of the access transistor with the well electrode and the source electrode of the one NVM transistor;

coupling a ground terminal with the source electrode of the other NVM transistor adapted to be grounded in the read mode; and respectively applying a high voltage $V_{GPH}$ and a high voltage $V_{WH}$ to a gate of the access transistor and the well electrode to thereby program the other NVM transistor to a programmed state with the second threshold voltage $V_{thp}$;

wherein $V_{GPH} > (V_{WH} + V_{thn})$; and wherein $V_{thn}$ is a threshold voltage of the access transistor and the access transistor is N-type.

17. The method according to claim 14, wherein when the storing bit represents one, the step of maintaining and programming comprises:

floating the control gates of the two NVM transistors;

maintaining the first threshold voltage $V_{the}$ of the one NVM transistor adapted to be grounded in the read mode by coupling a drain electrode of the access transistor with the well electrode and the source electrode of the one NVM transistor;

coupling a ground terminal with the source electrode of the other NVM transistor adapted to be coupled to the operating voltage terminal in the read mode; and respectively applying a high voltage $V_{GPH}$ and a high voltage $V_{WH}$ to a gate of the access transistor and the well electrode to thereby program the other NVM transistor to a programmed state with the second threshold voltage $V_{thp}$;

wherein $V_{GPH} > (V_{WH} + V_{thn})$; and wherein $V_{thn}$ is a threshold voltage of the access transistor and the access transistor is N-type.

18. The method according to claim 10, wherein the step of changing comprises:

changing the threshold voltages of the two NVM transistors to the erased state with the first threshold voltage $V_{the}$ by Fowler-Nordheim tunneling.

19. A method of reading a bit stored in a non-volatile memory cell after configuration, the NVM cell comprises an access transistor, a first NVM transistor and a second NVM transistor, two drain electrodes of the two NVM transistors being coupled to a source electrode of the access transistor, the method comprising:

coupling source electrodes of the two NVM transistors with an operating voltage terminal and a ground terminal respectively;

applying a first voltage $V_{CG}$ to control gates of the two NVM transistors to turn on one of the two NVM transistors to pass a voltage carried by one of the two terminals;

applying a second voltage $V_{GP}$ to a gate of the access transistor to turn on the access transistor; and outputting the stored bit by a drain electrode of the access transistor, wherein the hit corresponds to the voltage carried by one of the two terminals coupled to the turned on NVM transistor.

20. The method according to claim 19, wherein the two NVM transistors after configuration are in an erased state with a first threshold voltage $V_{the}$ and a programmed state with a second threshold voltage $V_{thp}$, respectively, and wherein the first threshold voltage $V_{the}$ is less than the second threshold voltage $V_{thp}$.

21. The method according to claim 20, wherein when the two NVM transistors are N-type, one NVM transistor in the erased state with the first threshold voltage $V_{the}$ is turned on to pass the voltage carried by one of the two terminals and the other NVM transistor in the programmed state is turned off after the step of applying the first voltage $V_{CG}$, wherein $(V_{DD}+V_{the})<V_{CG}<(V_{SS}+V_{thp})$, and wherein $V_{DD}$ denotes a voltage carried by the operating voltage terminal and $V_{SS}$ denotes a voltage carried by the ground voltage terminal.

22. The method according to claim 20, wherein when the two NVM transistors are P-type, one NVM transistor in the erased state with the first threshold voltage $V_{the}$ is turned off and the other NVM transistor in the programmed state with the second threshold voltage $V_{thp}$ is turned on to pass the voltage carried by one of the two terminals after the step of applying the first voltage $V_{CG}$, wherein $(V_{DD}+V_{the})<V_{CG}<(V_{DD}+V_{thp}-V_{SS})$, and wherein $V_{DD}$ denotes a voltage carried by the operating voltage terminal and $V_{SS}$ denotes a voltage carried by the ground voltage terminal.

23. The NVM cell according to claim 19, wherein the two NVM transistors are P-type and the two NVM transistors are embedded in an N-type well having a well electrode.

24. The method according to claim 23, further comprising:
coupling the well electrode with the operating voltage terminal.

25. The method according to claim 19, wherein the access transistor is N-type and $V_{GP}>(V_{DD}+V_{thn})$, and wherein $V_{DD}$ denotes a voltage carried by the operating voltage terminal and $V_{thn}$ is a threshold voltage of the access transistor.

* * * * *